United States Patent [19]

Lawler et al.

[11] Patent Number: 4,772,935
[45] Date of Patent: Sep. 20, 1988

[54] DIE BONDING PROCESS

[75] Inventors: Harlan Lawler, Milpitas; William S. Phy, Los Altos Hills, both of Calif.

[73] Assignee: Fairchild Semiconductor Corporation, Cupertino, Calif.

[21] Appl. No.: 875,345

[22] Filed: Jun. 17, 1986

Related U.S. Application Data

[63] Continuation-in-part of Ser. No. 683,995, Dec. 19, 1984, abandoned.

[51] Int. Cl.⁴ .......................................... H01L 21/58
[52] U.S. Cl. ................................. 357/71; 228/121; 228/123; 228/124
[58] Field of Search ............ 228/121, 123, 124, 180.2; 357/71

[56] References Cited

U.S. PATENT DOCUMENTS

| | | | |
|---|---|---|---|
| 3,651,562 | 3/1972 | Hambleton | 29/473.1 |
| 3,769,688 | 11/1973 | Kessler, Jr. et al. | 228/123 |
| 3,886,578 | 5/1975 | Eastwood et al. | 357/4 |
| 4,176,443 | 12/1979 | Iannuzzi et al. | 228/124 |
| 4,319,264 | 3/1982 | Gangulee et al. | 357/4 |
| 4,361,599 | 11/1982 | Wourms | 427/90 |
| 4,396,900 | 8/1983 | Hall | 427/89 |
| 4,417,387 | 11/1983 | Heslop | 29/591 |
| 4,433,342 | 2/1984 | Patel et al. | 357/2 |
| 4,434,544 | 3/1984 | Dohya et al. | 29/578 |
| 4,447,825 | 5/1984 | Oana et al. | 357/71 |
| 4,451,972 | 6/1984 | Batinovich | 29/583 |
| 4,454,528 | 6/1984 | Trueblood | 357/40 |

FOREIGN PATENT DOCUMENTS

WO8202457 7/1982 World Int. Prop. O. ......... 228/123

Primary Examiner—Kenneth J. Ramsey
Attorney, Agent, or Firm—Lee Patch; William H. Murray

[57] ABSTRACT

A process for bonding silicon die to a package. This process comprises the following steps: (a) providing to the back surface of the die an adhesion layer of material which exhibits superior adhesion to both the silicon die and a subsequently applied barrier layer; (b) providing to the adhesion layer a barrier layer which is impervious to silicon; (c) providing to the barrier layer a bonding layer; and (d) bonding the die to the package by activating a binder composition disposed at the interface of the package and the bonding layer. The barrier layer prevents the migration of silicon to the bonding layer, both at the time of application of the bonding layer to the die and at the time of bonding the die to the package. The adhesion layer enhances the adhesion of the barrier layer material to the back surface of the die. Titanium is the preferred adhesion layer material while tungsten is the preferred barrier layer material. The bonding layer preferably comprises gold while the preferred binder composition is a gold-tin alloy solder. The enhanced adhesion of the barrier layer which prevents silicon migration into the gold produces highly reliable bonds. In another embodiment, a stress relief layer is interposed between the adhesion layer and the back of the silicon die. The material of the stress relief layer is alloyed to the silicon at the back surface of the die which relieves stresses in the die and enhances the planarity of the back surface. This produces bonds which exhibit superior electrical and thermal contact characteristics.

6 Claims, 1 Drawing Sheet

DIE BONDING PROCESS

CROSS REFERENCE TO RELATED APPLICATIONS

This application is a continuation-in-part of application Ser. No. 683,995, filed Dec. 19, 1984, now abandoned.

BACKGROUND OF THE INVENTION

The present invention relates generally to processes for fabricating semiconductor integrated circuit devices and more particularly to a process for bonding a semiconductor die to its package.

In order to facilitate handling and the making of electrical connections thereto, it is necessary to securely place the integrated circuit device, or die, in a package. Electrical connections are thereafter made from predetermined points on the device to contacting pins on the package. Since the electrical connections from the device to the contacting pins are necessarily very fine, they are also very fragile; and, unless the die is securely and permanently fastened to the package, mechanical shock or vibration may separate the die from the package causing one or more of the electrical contacts to break which in turn causes of failure of the intergrated circuit device. In addition to establishing a secure mechanical connection, it is important that good electrical and thermal contact be established and maintained between the die and its package.

A typical method of bonding the die to the package is to place a preform of gold-tin solder in a recess in the package, which recess is dimensioned to receive the die. The back surface of the die is coated with a layer of gold to which the preform adheres after melting. It has been found that the above described bonding process can result in unsatisfactory bonds due to the migration of silicon from the die into its gold layer. Such migration occurs during the process of coating the gold on the back surface of the die and alloying the gold thereon.

Specifically, the gold is deposited on this back surface and the resultant combination is heated in order to alloy the gold onto the silicon die. This process requires a high temperature, generally about 400° C., which causes silicon migration into the gold. Further, the eutectic process of adhering the die to the package also requires a similar high temperature which, in turn, causes additional silicon migration to the bonding site. This resultant silicon adulteration of the gold and the gold-tin preform acts to inhibit formation of a reliable bond between the die and the package.

Another problem which reduces the effectiveness and reliability of the die to package bond relates to non-planarity of the back surface of the wafer. Typically, the back side of the wafer is ground to eliminate oxides and other materials which accumulate on the back surface of the wafer during processing. Removal of such materials is necessary in order to establish good electrical and thermal contact between the die and their packages. However, the grinding operation imparts surface stresses which cause the back surface of the wafer to warp. As a result, the die produced from the wafer will have non-planar back surfaces. Such surfaces cannot make the intimate, flush contact with mating planar surfaces of the die packages required to produce good electrical and thermal contact therebetween.

SUMMARY OF THE INVENTION

Accordingly, it is an object of the present invention to provide a method for establishing reliable bonds between semiconductor die and their packages.

It is a further object of the present invention to provide a method for establishing bonds between semiconductor die and their packages, which bonds exhibit superior mechanical and electrical characteristics.

It is another object of the present invention to provide a barrier layer on a back surface of a semiconductor device for preventing migration of silicon into a metallic bonding layer of the semiconductor device thereby enhancing the adherence of this bonding layer to a package.

It is still another object of the present invention to provide a semiconductor device including means for enhancing the adherence of the barrier layer to the back surface of the semiconductor device.

It is yet another object of the present invention to provide means for improving the planarity of the back surfaces of semiconductor die in order to effect bonds having improved electrical and thermal contact between the die and their packages.

These and other objects which will become apparent are achieved in accordance with the present invention which comprises a process for bonding a silicon die to a package. The process comprises the steps of applying a metallic adhesion layer onto a back surface of the silicon wafer die. A barrier layer of refractory metal is formed over the barrier layer. A layer of bonding metal is then formed over the barrier layer. The wafer is then diced into a plurality of individual die. Each die is then bonded to its package by activating a binder composition disposed at the interface of the package and the bonding metal layer.

In one embodiment of the invention, the adhesion layer comprises titanium, the barrier layer comprises tungsten and the bonding layer comprises gold. The binding composition comprises a gold-tin alloy. The gold layer is brought into contact with the gold-tin alloy and is heated to approximately 325° C. which permits a gold and gold-tin bond to form via a eutectic reaction. The titanium adhesion layer enhances adhesion of the barrier layer to the back surface of the silicon die. The tungsten barrier layer prevents the penetration of silicon from the die into the gold bonding layer during the soldering process.

In an alternate embodiment of the invention, a stress relief layer of gold is disposed between the adhesion layer and the back surface of the silicon wafer. In this alternate embodiment, the gold layer is applied to the back surface of the die and alloyed with the silicon. This stress relieves the wafer and results in its planarization. The titanium adhesion layer is then formed, along with the barrier and bonding layers, over the gold stress relief layer and the bonding process, in accordance with the invention as set forth above, is then completed.

Other objects, features and advantages of the present invention will become more fully apparent from the following detailed description of the preferred embodiment, the appended claims and the accompanying drawing.

DETAILED DESCRIPTION OF THE DRAWINGS

DETAILED DESCRIPTION OF A PREFERRED EMBODIMENT

Figure 1:
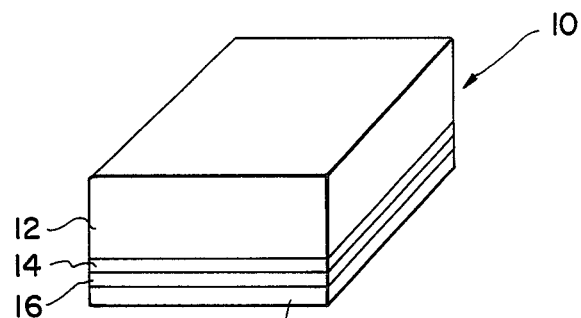
FIG. 1 is a perspective view of a die having an adhesion layer, a barrier layer and a bonding layer in accordance with the present invention.

Referring to FIG. 1, a die generally referred to as 10, comprises a silicon substrate 12 having a metallic adhesion layer 14 formed over a back surface thereof. The metallic adhesion layer 14 preferably comprises titanium which exhibits excellent adhesion to silicon and tungsten. A barrier layer 16 is formed over the adhesion layer 14. The barrier layer 16 comprises a refractory metal, preferably tungsten. A bonding layer 18 is formed over the barrier layer 16. The bonding layer 18 comprises a precious or noble metal, preferably gold. The adhesion 14, barrier 16 and bonding 18 layers are preferably formed as follows.

The back surface of a silicon wafer is lapped, ground or etched to obtain a substantially flat, smooth, oxide-free surface. The surface is then sputter etched to assure cleanliness before any metal is applied.

The titanium adhesion layer 14 is then formed to a predetermined thickness on the back surface of the wafer utilizing a known technique such as sputtering. In a preferred embodiment, titanium is sputtered onto the back surface of the wafer to form the adhesion layer 14 having a thickness preferably equal to about 500 Å. Although a thickness of 500 Å is preferred, other thicknesses in a range of 300–1500 Å are operable and are within the scope of the present invention. The tungsten barrier layer 16 is then formed over the adhesion layer 14 to a predetermined thickness utilizing a known technique such as sputtering. In a preferred embodiment, tungsten is sputtered onto the adhesion layer 14 to a thickness of about 500 Å to form the barrier layer 16. Although a thickness of 500 Å is preferred, other thicknesses in a range of 300–1500 Å are operable and are within the scope of the present invention. The bonding layer 18 of the precious or noble metal is then formed over the barrier layer 16 to a predetermined thickness utilizing a known technique such as sputtering. In the preferred embodiment, gold is sputtered onto the barrier layer 16 to a thickness of about 3,000 Å to form the bonding layer 18. Although a thickness of 3,000 Å is preferred, other thicknesses in a range of 1,000–8,000 Å are operable and are within the scope of the present invention. The sputter etching, titanium application, tungsten application, and gold application are preferably done consecutively as a continuous operation.

Figure 2:
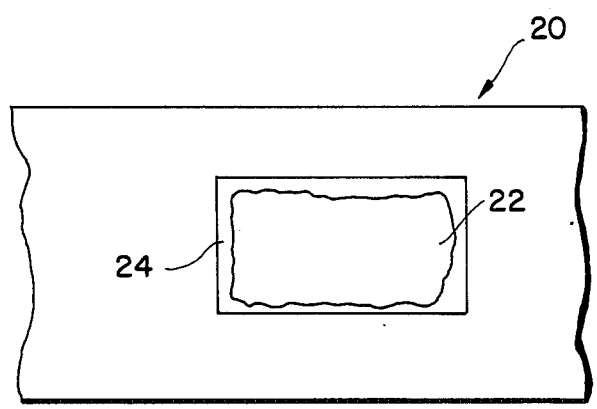
FIG. 2 is a top view of a package to which a die, constructed in accordance with the present invention, can be bonded.
Figure 3:
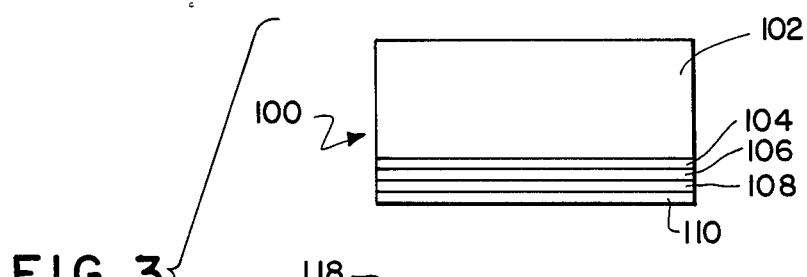
FIG. 3 is a side elevational view of an alternate preferred embodiment of a die constructed in accordance with the present invention, a header to which the die is to be bonded, and a binding composition disposed therebetween.
Figure 3:
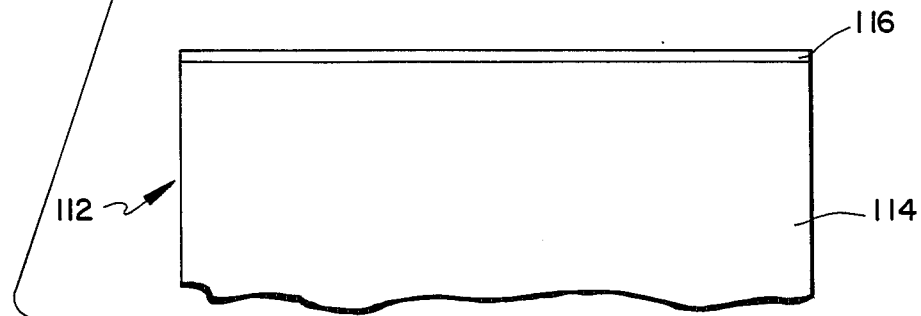

Upon completion of the above steps, the wafer is diced and individual dies such as the one shown in FIG. 1 are produced. Binding the die 10 to a package 20, as shown in FIG. 2, is preferably accomplished through employment of a solder preform 22. The solder preform 20 preferably is made of a precious metal eutetic such as gold-tin, gold-silicon, or gold-antimony. The bonding procedure involves, first of all, heating the package 20 to a predetermined temperature, for example about 305° C. when using a gold-tin solder preform. The solder preform 22 is then placed at the site of proposed bonding, for example in a recess 24 as shown in FIG. 3. When the preform 22 is melted, the die 10 is placed thereon and excess preform 22 is wrung from under the die 10. The resultant assembly is then cooled, and bonding of the die 10 to the package 20 is complete.

Referring now to FIG. 3, there is shown an alternate preferred embodiment of a die, generally designated 100, constructed in accordance with the present invention. The die 100 comprises a silicon substrate 102 having a stress relief layer 104 formed on the back surface thereof. The stress relief layer 104 comprises gold, aluminum or nickel. It is preferred that the stress relief layer 104 comprises gold which is sputtered onto the back surface of the substrate 102 to a thickness of 10,000 Å. Although a thickness of 10,000 Å is preferred, other thicknesses in a range of 3,000–15,000 Å are operable and are within the scope of the present invention. The gold is then alloyed with the silicon at the back surface of the substrate 102 in a nitrogen ambient at 415° C. The gold surface is chemically cleaned then sputter etched to remove any silicon dioxide ($SiO_2$) due to out diffusion.

A titanium adhesion layer 106 is then formed over the stress relief layer 104. Next, a tungsten barrier layer is formed over the titanium adhesion layer. A gold bonding layer 110 is then formed over the tungsten barrier layer 108. The titanium adhesion layer 106, tungsten barrier layer 108 and gold bonding layer 110 are formed in accordance with processes described above in conjunction with FIG. 1.

Upon completion of the above steps, the wafer is diced and the individual die are attached to substrates. As shown in FIG. 3, a preferred embodiment of a substrate 112 comprises a ceramic header 114 having a layer of gold 116 formed on an attachment surface of the header 114. The header 114 may be constructed of ceramic, Kovar ® or Alloy 42. The gold layer 116 is formed on the header 114 by printing, plating or vapor deposition to a thickness of 1,000 Å. Although a thickness of 1,000 Å is preferred, other thicknesses in a range of 1,000–50,000 Å are operable. The die is then attached to the substrate using a preform 118. The preform 118 is preferably an 80:20 gold:tin solder preform having an exemplary thickness of between 0.5–1.0 mil. The bonding procedure involves heating substrate in an enert atmosphere, melting then re-freezing the bonding medium or preform.

The purpose of the barrier layer is to prevent the migration of silicon to the gold layer, both at the time of application of the gold layer to the die and at the time of bonding the die to the package. Additionally, the presence of the barrier layer requires less gold to be used for the layer. In the prior art, because silicon migrated into the gold, a greater quantity of gold was required to endeavor to overcome dilution by the silicon. In the instant die, however, because silicon cannot migrate through the barrier layer, the gold layer does not experience such dilution. As a result, a compensatory amount for dilution need not be employed. Further, the presence of the barrier layer enables a better eutectic bonding which can be performed at a lower temperature because no silicon can migrated to a site within the bonding composition. Thus, bonding using a gold-tin alloy solder can be carried out at a temperature of about 305° C. as opposed to a temperature of about 330° C., the standard processing temperature.

It is important to consider the doping characteristics when providing a metal barrier layer material. Thus, for example, a P-type semiconductor would use a P-type metal; an N-type semiconductor would use an N-type metal. It is preferred that the barrier layer be sputtered onto the back surface of the die, a process known in the art which involves the use of metal vapors which subsequently condense onto the die. Layers so applied can range in thickness from about 500 Å to about 10,000 Å (1 micron). The barrier layer also could be applied by an evaporator, also as known in the art. In some cases, the barrier layer must be able to conduct heat and current.

As previously stated, the barrier layer material is preferably a refractory metal such as tungsten. Although it has been found that tungsten acts as an excellent barrier to the migration of silicon, its adherence to silicon is only moderate. The titanium adhesion layer is therefore interposed between the tungsten barrier and the silicon substrate to enhance the adhesion of the barrier layer to the substrate. It has been found that titanium exhibits superior adhesion to both silicon and tungsten. As a result, the reliability of the resultant bond between the die and its substrate is enhanced.

The stress relief layer 104, which is disposed between the adhesion layer 106 and the back surface of the silicon wafer 106 in the alternate preferred embodiment depicted in FIG. 3, serves to stress relieve the wafer and enhance its planarity. As previously stated, the wafer is stressed due to the grinding operation which is performed to remove oxides and other materials from the back surface of the wafer prior to subsequent processing. These stresses impart an undesirable warp in the wafer. Alloying the gold in the stress relief layer 106 to the silicon at the back surface of the wafer 102 substantially eliminates this warping thereby restoring the wafer to a planar configuration. This enhances the electrical and thermal contact of the resulting dies to their respective packages by providing a substantially flush mating interface.

The preferred binder composition is a gold-tin alloy solder which is, of course, activated by heat. As earlier related, the solder process can be performed at a temperature below that utilized in standard processing.

As would be recognized by those having skill in the art, the process here disclosed provides many benefits. First of all, temperatures lower than those required for prior art bonding processes can be employed. Secondly, gold consumption is reduced since the amount of gold in the gold layer 16 can be reduced, as earlier described, due to prohibition of silicon migration. Thirdly, the reliability of the bond is enhanced, again due to prohibition of silicon migration. Additionally, electrical and thermal contact between the die and its package is enhanced by improving the planarization of the mating surface. Finally, from an operational standpoint, the process is relatively simple to perform, thereby requiring no special skills on the part of an operator.

It will be understood that various changes in the details, materials and arrangements of the parts which have been herein described and illustrated in order to explain the nature of this invention, may be made by those skilled in the art within the principle and scope of the invention as expressed in the following claims.

What is claimed is:

1. A process for bonding a silicon die to a package, said process comprising the steps of:
   (a) forming an adhesion layer onto a back surface of a silicon wafer;
   (b) forming a barrier layer over said adhesion layer by sputtering tungsten onto said adhesion layer to a predetermined thickness in the range of 300–1,500 Å;
   (c) forming a layer of bonding material over said barrier layer;
   (d) dividing said wafer into a plurality of die; and
   (e) bonding at least one of said die to a package by activating a binder composition disposed at the interface of the package and said bonding layer.

2. A process for binding silicon die to a package, said process comprising the steps of:
   (a) forming an adhesion layer onto a back surface of a silicon wafer;
   (b) forming a barrier layer over said adhesion layer;
   (c) forming a layer of bonding material over said barrier layer;
   (d) dividing said wafer into a plurality of die; and
   (e) bonding at least one of said die to a package by activating a binder composition disposed at the interface of the package and said bonding layer, which binder composition comprises a precious metal eutectic.

3. The process according to claim 2 wherein the binder composition is selected from the group consisting essentially of gold-tin, gold-silicon and gold-antimony.

4. The process according to claim 3 wherein the binder composition comprises a gold-tin alloy solder prefrom.

5. The process according to claim 4 wherein the binder composition is activated by a temperature of about 305° C.

6. In a semiconductor device including a bonding metal layer disposed on a back surface of a silicon die for bonding said die to a package, an improvement comprising an adhesion layer of titanium disposed adjacent said back surface of said silicon die and a barrier layer of tungsten interposed between said adhesion layer and said bonding layer.

* * * * *